United States Patent [19]

Iwatani et al.

[11] 4,310,792
[45] Jan. 12, 1982

[54] SEMICONDUCTOR VOLTAGE REGULATOR

[75] Inventors: Shiroh Iwatani; Mitsuharu Morishita, both of Himeji, Japan

[73] Assignee: Mitsubishi Denki Kabushiki Kaisha, Tokyo, Japan

[21] Appl. No.: 48,463

[22] Filed: Jun. 14, 1979

[30] Foreign Application Priority Data

Jun. 30, 1978 [JP] Japan .................................. 53-80338
Jul. 7, 1978 [JP] Japan .................................. 53-83299

[51] Int. Cl.³ .......................... H02J 7/16; H02P 9/30; H01L 27/00
[52] U.S. Cl. ..................................... 322/28; 307/303; 307/315; 322/73
[58] Field of Search ................... 322/28, 73; 307/303, 307/315; 323/22 T

[56] References Cited

U.S. PATENT DOCUMENTS

| | | |
|---|---|---|
| 3,532,962 | 10/1970 | Balcke et al. |
| 3,538,362 | 11/1970 | Cheetham et al. |
| 3,539,907 | 11/1970 | Linstedt |
| 3,596,115 | 7/1971 | Conzelmann ........................ 307/303 |
| 3,876,926 | 4/1975 | Schott et al. ........................ 322/28 |
| 4,054,828 | 10/1977 | Conzelmann et al. ............... 322/28 |
| 4,128,801 | 12/1978 | Gansert et al. ...................... 322/28 |

FOREIGN PATENT DOCUMENTS 1940232 8/1970 Fed. Rep. of Germany ........ 322/28

Primary Examiner—Robert J. Hickey
Attorney, Agent, or Firm—Wenderoth, Lind & Ponack

[57] ABSTRACT

The disclosed semiconductor voltage regulator comprises an NPN power transistor connected to a field coil of a battery charging AC generator and turned on and off through an NPN control transistor under the control of a Zener diode, a suppression diode for the field coil, and passive elements. The transistors especially including the power transistor and diodes without or with resistors form an integrated semiconductor element on a semiconductor substrate while the passive elements form a hybrid thick film integrated circuit on a ceramic substrate. The integrated element may be disposed on the ceramic substrate underlaid with a heat sink or directly on the heat sink.

3 Claims, 5 Drawing Figures

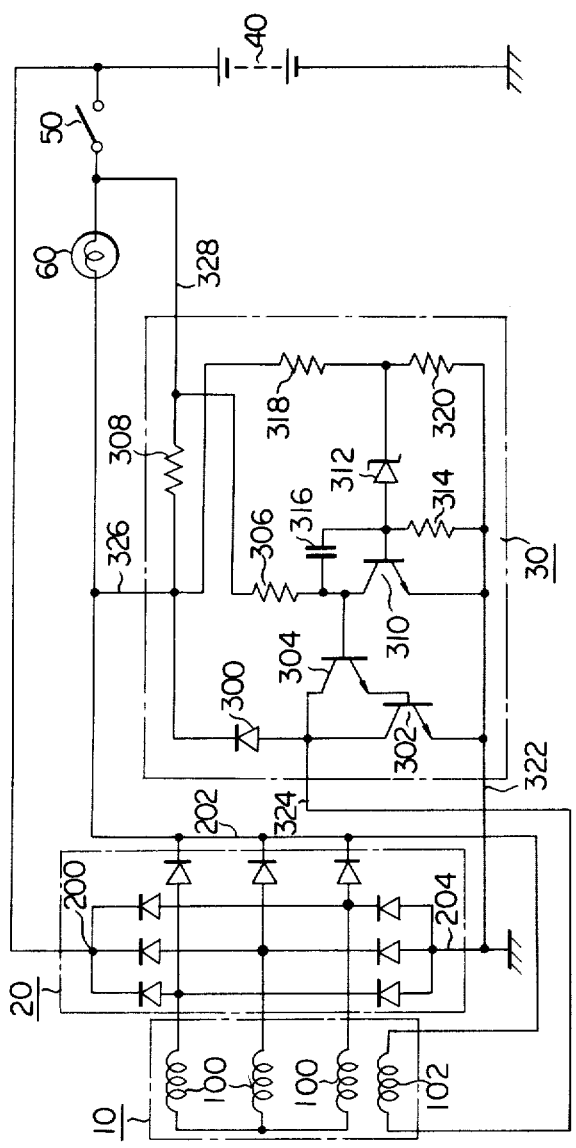
FIG. 1
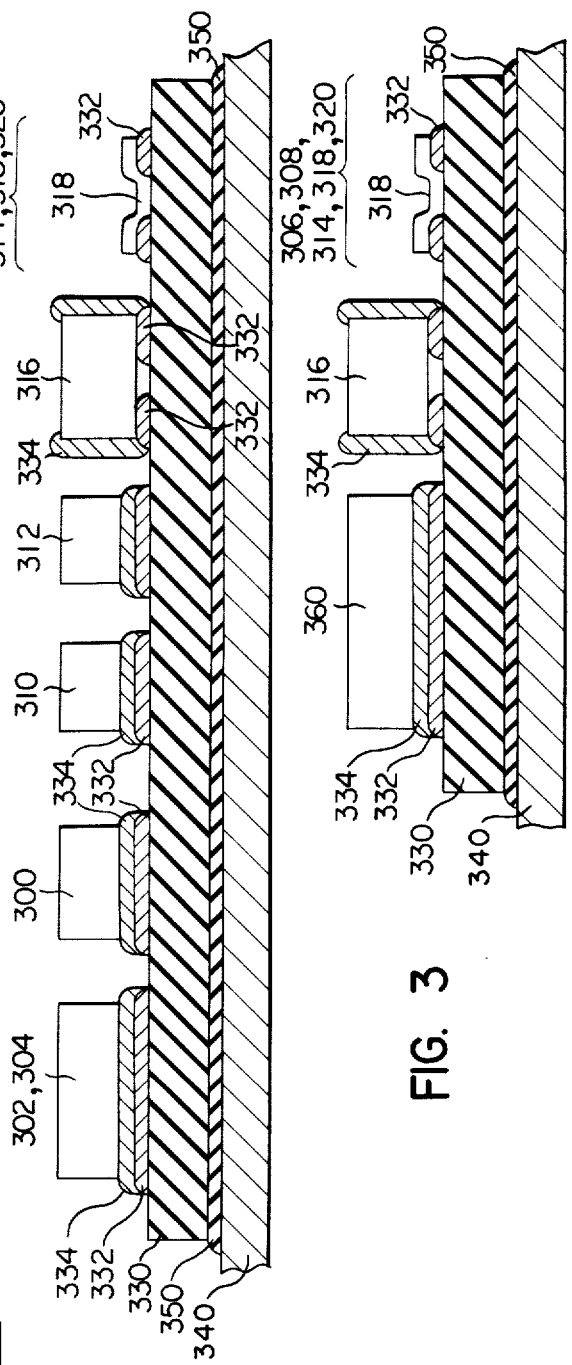
FIG. 2 PRIOR ART
FIG. 3

SEMICONDUCTOR VOLTAGE REGULATOR

BACKGROUND OF THE INVENTION

This invention relates to a semiconductor voltage regulator device for controlling an output voltage from an AC generator driven as by an internal combustion engine to a predetermined magnitude and more particularly to a construction of such a semiconductor voltage regulator device.

Semiconductor voltage regulator devices of the type referred to comprise the NPN type power transistor connected between ground and one end of a field winding disposed on an associated AC generator and excited with a full-wave rectified output voltage from the AC generator, and control circuit elements for controlling ON-OFF operation of the power transistor thereby to control the output voltage from the AC generator to a predetermined magnitude. The control circuit elements include a Zener diode connected to a voltage dividing resistance network connected between the other end of the field winding put at a positive potential and ground to provide a reference voltage source, and a control transistor responsive to the operation of the Zener diode to effect the ON-OFF control of the power transistor.

Conventional semiconductor regulators as described above have had circuit elements including transistors, diodes, resistors and capacitors separately disposed on a ceramic substrate to form the hybrid thick film integrated circuit thereon. This has resulted in a great number of bondings and therefore in a decrease in reliability. Also, since the respective circuit elements are separately bonded to the hybrid thick film integrated circuit, it has been difficult to automatically assemble the circuit elements into the hybrid thick film integrated circuit resulting in an extremely poor mass-productivity. In addition, due to a large number of the circuit elements used, the ceramic substrate has been large and, as a matter of course, required to be encased in a large casing resulting in the disadvantage that the semiconductor voltage regulator becomes large-sized.

Accordingly, it is an object of the present invention to eliminate the disadvantages of the prior art practice as described above by the provision of a new and improved construction of a semiconductor voltage regulator device high in reliability and easy to be automatically assembled while being small-sized.

SUMMARY OF THE INVENTION

The present invention provides a semiconductor voltage regulator device comprising an NPN type power transistor connected between one end of a field winding disposed on a AC generator, the field winding including the other end connected to a positive potential and being excited with a rectified output voltage from the AC generator, control circuit elements for controlling the ON-OFF operation of the NPN type power transistor thereby to control the output voltage from the AC generator to a predetermined magnitude, a common semiconductor substrate having respective active elements disposed thereon, and a substrate for a hybrid thick film integrated circuit having passive elements disposed thereon.

In a preferred embodiment of the present invention, the semiconductor voltage regulator device may comprise an NPN type power transistor connected between one end of a field winding disposed on an AC generator and ground, the field winding including the other end connected to a positive potential and being excited with a full-wave rectified output voltage from the AC generator, a control circuit for controlling the ON-OFF operation of the NPN type power transistor thereby to control the output voltage from the AC generator to a predetermined magnitude, a diode for absorbing inductive energy generated on the field winding, and a common semiconductor substrate having the NPN type power transistor, the control circuit and the diode disposed thereon.

BRIEF DESCRIPTION OF THE DRAWINGS

The present invention will become more readily apparent from the following detailed description taken in conjunction with the accompanying drawings in which:

FIG. 1 is a circuit diagram of a control device for controlling an output voltage from an AC generator to a predetermined magnitude in which the present invention is interested;

FIG. 2 is a sectional view of a conventional construction of the semiconductor voltage regulator device shown in FIG. 1 with parts illustrated in elevation;

FIG. 3 is a sectional view of one embodiment according to the construction of the present invention into which the semiconductor voltage regulator device shown in FIG. 1 is assembled with parts illustrated in elevation.

Through the Figures like reference numerals designate the identical or corresponding components.

DESCRIPTION OF THE PREFERRED EMBODIMENTS

Figure 4:
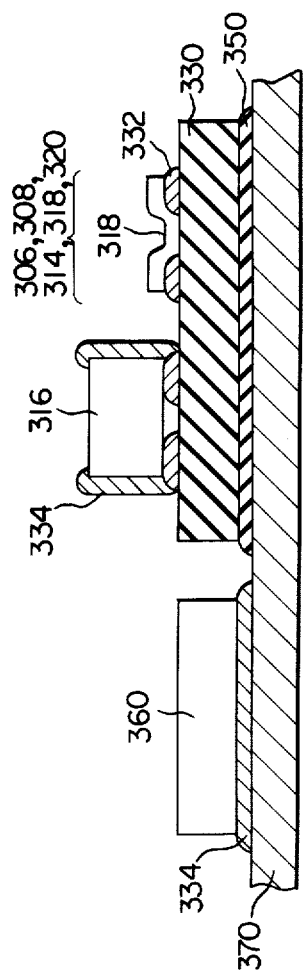
FIG. 4 is a view similar to FIG. 3 but illustrating a modification of the present invention.

Referring now to FIG. 1 of the drawings, there is illustrated, by way of example, a control circuit for controlling an output voltage from an AC generator to a predetermined magnitude. The arrangement illustrated comprises an AC generator generally designated by the reference numeral 10 and including a three-phase star-connected stator winding 100 and a field winding 102, and a three-phase full-wave rectifier bridge generally designated by the reference numeral 20 and connected to the stator winding 100 to full-wave rectify an output voltage from the AC generator 10. The three-phase full-wave rectifier bridge 20 includes a first, a second and a third rectified output terminal 200, 202 and 204 respectively to produce a first and a second rectified voltage across the first and third output terminals and across the second and third output terminals respectively. The third output terminal 204 is connected to ground.

The field winding 102 of the AC generator 10 and the output terminals 202 and 204 of the rectifier bridge 20 are connected to a semiconductor voltage regulator generally designated by the reference numeral 30 and operative to control a rectified output voltage from the AC generator 10 to a predetermined magnitude. More specifically, the semiconductor voltage regulator 30 includes a suppression diode 300 connected at the anode electrode to one end of the field winding 102 of the AC generator 10 and also to collector electrodes of two NPN type transistors 302 and 304 interconnected in a Darlington configuration. The suppression diode 300 is operative to absorb inductive energy generated on the field winding 102. The transistor 302 includes an emitter electrode connected to the third output terminal 204 of the full-wave rectifier bridge 20 and therefore to ground and is driven by the transistor 304 to act as an output power transistor for breaking and making a field current through the field winding 102.

The driving transistor 304 includes a base electrode connected to a base resistor 306 subsequently connected to the cathode electrode of the suppression diode 300 through an initial excitation resistor 308 and also to a collector electrode of an NPN type control transistor 310. The control transistor 310 includes a base electrode connected to an anode electrode of a Zener diode 312 and also to its emitter and collector electrodes through a base resistor 314 and a capacitor 316 respectively, the emitter electrode being connected to that of the power transistor 302. The control transistor 310 effects the ON-OFF control of the transistors 304 and 302. The Zener diode 312 includes a cathode electrode connected to the junction of resistors 318 and 320 serially interconnected across the second and third output terminals 202 and 204 respectively of the full-wave rectifier bridge 20 to form a voltage divider. The Zener diode 312 is responsive to the rectified output voltage from the AC generator 10 reaching a predetermined magnitude, or a voltage at the junction of the resistors 318 and 320 reaching a predetermined magnitude to be put in its conducting state.

The semiconductor voltage regulator 30 include a first connection terminal 322 for connecting the emitter electrodes of the transistors 302 and 304 to ground, a second connection terminal 324 for connecting the collector electrodes thereof to the one end of the field coil 102 of the AC generator 10, a third connection terminal 326 for connecting the resistor 318 and the cathode electrode of the suppression diode 300 to the second output terminal 202 of the full-wave rectifier bridge 20 subsequently connected to the other end of the field winding 102, and a fourth connection terminal 328 connected to the junction of the resistors 306 and 308.

The first output terminal 200 of the full-wave rectifier bridge 20 is connected to a positive side of a storage battery 40 including a negative side connected to ground and therefore to the third output terminal 204 of the rectifier bridge 20. Also the positive side of the storage battery 40 is connected to the second output terminal 202 of the rectifier bridge 20 through a series combination of a key type ignition switch 50 and a charge indication lamp 60.

When the key switch 50 is put in its closed position, the storage battery 40 supplies a base current to the driving transistor 304 through the now closed switch 50 and the base resistor 306 to turn the transistors 304 and 302 on thereby to cause a field current to flow through the switch 50, the charge indication lamp 60, the field winding 102 of the AC generator 10 and the now conducting transistors 302 and 304. This results in the generation of a field magnetomotive force. Also the lamp 60 lights indicating that the storage battery 40 is not charged.

At the same time, an associated internal combustion engine (not shown) is started to rotate the AC generator 10. The generator 10 induces an AC output voltage across the stator winding 200 and the full-wave rectifier bridge 20 rectifies the induced AC output voltage into a DC output voltage. Initially, the rectified output voltages from the full-wave rectifier bridge 20 and therefore a potential at the junction of the resistors 318 and 320 is low enough to maintain the Zener diode 312 in its nonconducting state.

Then the AC generator 10 gradually increases in rotational speed until the output voltage therefrom becomes equal to or higher than a predetermined magnitude. At that time, the potential at the junction of the resistors 318 and 320 is also high enough to conduct the Zener diode 312. When conducted, the Zener diode 312 causes a base current to flow through the control transistor 310 via the same to turn it on. This turn-on of the control transistor 310 causes the transistors 304 and 302 to be turned off resulting in the interruption of the field current flowing through the field winding 102. Thus the output voltage from the AC generator 10 decreases to be less than the predetermined magnitude whereupon the Zener diode 312 is returned back to its original nonconducting state to turn the control transistor 310 off. Therefore the transistors 304 and 302 are again turned on to permit the field current to flow again through the filed winding 102 with the result that the AC generator 10 again increases in output voltage.

From the foregoing it is seen that transistors 302 and 304 are turned on and off by a control circuit including the control transistor 310, the Zener diode 312 and the associated capacitor 316 and resistors 314, 318 and 320.

The process as described above is repeated to control the output voltage from the AC generator 10 to the predetermined magnitude. The controlled voltage from the AC generator 10 is full-wave rectified by the rectifier bridge 20 and applied to charge the storage battery 40 to a predetermined voltage.

On the other hand, a rectified output voltage developed at the second output terminal 202 of the full-wave rectifier bridge 20 is substantially equal to the voltage across the storage battery 40 and takes over the supply of the field current. Under these circumstances, the charge indication lamp 60 is not lit, indicating that the storage battery 40 is being charged.

As shown in FIG. 1, the semiconductor voltage regulator 30 comprises a plurality of active elements or the transistor 302, 304 and 310, and the diodes 300 and 312, and a plurality of passive elements or the resistors 306, 308, 314, 318 and 320 and the capacitor 316. Heretofore, all those elements have been disposed on predetermined discrete portions of the surface of a single ceramic substrate to form a hybrid thick film integrated circuit on the ceramic substrate such as shown in FIG. 2. In FIG. 2, the transistors 302 and 304 interconnected in the Darlington configuration, the suppression diode 300, the control transistor 310 and the Zener diode 312 are fixedly secured in a predetermined pattern to one surface, in this case, the upper surface as viewed in FIG. 2 of a single ceramic substrate 330 through bonding layers 334 and electrodes 332 respectively. Each of the electrodes 332 is formed of a thick film conductor printed and baked on a selected one of predetermined discrete portions of the upper surface of the ceramic substrate 330 and the bonding layers 334 are formed of a solder or gold to bond those active elements underlaid therewith to the mating electrodes 332 respectively. Those active elements are schematically shown by blocks labelled the reference numerals identical to those identifying the elements. For example, block 310 designates the control transistor 310.

Further the capacitor 316 schematically shown by block 316 is fixedly secured at its specified position to the upper surface of the ceramic substrate 330 through two spaced electrodes 332 to be spaced from the Zener diode 312 by having two bonding layers 332 attached to the bilateral surfaces thereof and connected to the adjacent electrodes 332. Then the resistor 318 is shown as extending across two spaced electrodes 332 and including an intermediate portion contacting the ceramic substrate 330 with a predetermined spacing formed between the same and the capacitor 316. The resistor 318 is formed of a resistor printed and baked on a predetermined portion of the upper surface of the ceramic substrate 330. The other resistors 306, 308, 314 and 320 are similarly formed on predetermined portions of the substrate's surface although they are not shown only for purposes of illustration.

Then the ceramic substrate 330 is attached on the lower surface to a heat sink 340 through an adhesive layer 350.

Conventional constructions such as shown in FIG. 2 are disadvantageous in that the number of bondings is large and therefore the reliability is low because all the active and passive elements are disposed on in spaced relationship on the ceramic substrate 330 to form the hybrid thick film integrated circuit thereon. Also since the respective elements are individually bonded to the associated electrodes and to one another, it has been difficult to perform the automatic assembling operation resulting in an extremely poor mass-productivity. Further the ceramic substrate has been required to be large because of a large number of the individual elements. This has, as a matter of course, led to a large casing for encasing the active and passive elements resulting in another disadvantage that the resulting device is large-sized.

The present invention eliminates the disadvantages of the prior art practice as described above by disposing the active elements on a common semiconductor substrate.

Referring now to FIG. 3, there is illustrated one embodiment according to the construction of the present invention into which the semiconductor voltage regulator 30 as shown in FIG. 1 is assembled. The arrangement illustrated is different from that shown in FIG. 2 only in that in FIG. 3, a single block 360 is substituted for blocks 302-304, 300, 316 and 312. That is, the power, driving and control transistors 302, 304 and 310 respectively, the suppression diode 300 and the Zener diode 312 forming the active elements are incorporated into an integrated semiconductor element disposed on a common semiconductor substrate. Block 360 designates the integrated semiconductor element including the semiconductor substrate. The integrated semiconductor element 360 has a multi-layer structure including an N+ type semiconductor substrate formed of an N+ type collector region of the power transistor 302 and active elements 300, 302, 304, 310 and 312 disposed thereon.

Then the integrated semiconductor element 360 is fixedly secured to the ceramic substrate 330 through the bonding layers and electrodes. However, the element 360 is shown in FIG. 3 as being disposed on the ceramic substrate 330 through the single bonding layer 334 and the single electrode 332. Thus only the passive elements or the capacitor 316 and the resistors such as the resistor 318 are disposed on the ceramic substrate 330 to form a hybrid thick film circuit thereon.

The arrangement illustrated in FIG. 4 is different from that shown in FIG. 3 only in that in FIG. 4 the integrated semiconductor element 360 is directly brazed through the electrodes 334 to a heat sink 370 substituted for the heat sink 340 shown in FIGS. 2 and 3.

Figure 5:
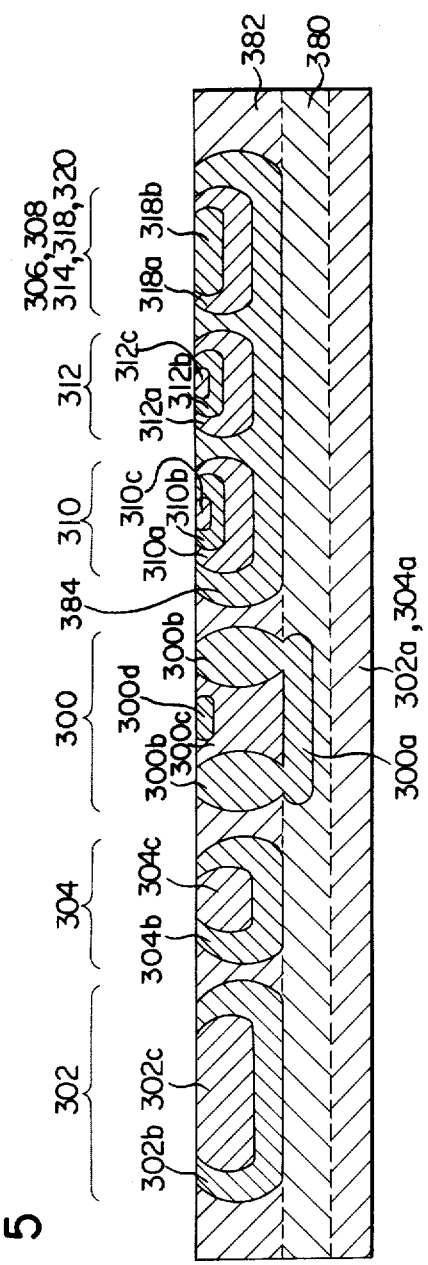
FIG. 5 is a sectional view of the details of a modification of the integrated semiconductor element schematically shown in FIG. 3 or 4.

FIG. 5 shows the details of a modification of the integrated semiconductor element 360 schematically illustrated in FIG. 3 or 4. The arrangement illustrated comprises an N+ type semiconductor substrate 302a—304a forming the collector region of the power and driving transistors 302 and 304, a first N− type semiconductor layer 380 disposed on the semiconductor substrate 302a–302a, and a second N− type semiconductor layer 382 disposed on the first N− type semiconductor layer 380.

The power transistor 302 is disposed on the lefthand end portion as viewed in FIG. 5 of the three layer structure 302a—302a, 380, 382 and includes a P+ base region 302b located in the second N+ type semiconductor layer 382 to encircle an N+ type emitter region 302c with both regions exposed to the surface of the second N− type semiconductor layer 382. The driving transistor 304 is disposed on the right as viewed in FIG. 5 of the power transistor 302 to be spaced therefrom by a predetermined interval and includes a P+ type base region 304b and an N+ type emitter region 304c similar to those of the power transistor 302.

The suppression diode 300 is disposed, on the right as viewed in FIG. 5 of the driving transistor 304 to be spaced therefrom by a predetermined interval and includes an anode region 300a embedded in the first N− type semiconductor layer 380 lengthwise thereof, and a pair of P+ type, anode walls 300b extending from both ends of the anode region 300a to traverse substantially perpendicularly the second N+ type semiconductor layer 382. The anode walls 300b are exposed to the surface of the second N− type semiconductor layer 382 and define an N− type cathode region 300c therebetween. Then a N+ type cathode region 300d is disposed within the N− type cathode region 300c to be exposed to the surface of the second N− type semiconductor layer 382.

The remaining portion of the second N− type semiconductor layer 382 is shown in FIG. 5 as including the control transistor 310, the Zener diode 312 and the resistor 318 disposed at predetermined intervals in the second N− type semiconductor layer 382 in the named order and surrounded by a P+ type isolation semiconductor region 384 for the control transistor 310 extending throughout the thickness of the second N− type semiconductor layer 382 and spaced from the suppression diode 300 by a predetermined interval. The control transistor 310 is nearest to the diode 300 and includes an N+ type collector region 310a, a P+ type base region 310b and an N+ type emitter region 310c having respective ends exposed to the surface of the second N− type semiconductor layer 382.

The Zener diode 312 is disposed in an N+ type semiconductor portion 312a located on the right as viewed in FIG. 5 of the control transistor 310 and includes a P+ type anode region 312b and an N+ type cathode region 312c having respective ends exposed to the surface of the second N− type semiconductor layer 382.

The resistor 318 is disposed in another N+ type semiconductor portion 318a located on the right as viewed in FIG. 5 of the zener diode 312 and includes a P+ type resistance region 318b.

The remaining resistors 306, 308, 314 and 320 are similarly formed on predetermined portions of the second N− type semiconductor layer 382 although they are not shown only for purposes illustration.

In the arrangement of FIG. 5, it is noted that the capacitor 316 is separately manufactured and electrically connected to the control transistor 310. Thus the capacitor 316 is not illustrated in FIG. 5.

If desired, the resistors may be omitted from the arrangement of FIG. 5.

In order to manufacture the arrangement of FIG. 5, the first N+ type semiconductor layer 380 is epitaxially grown on one surface, in this case, the upper surface as viewed in FIG. 5 of the N+ type semiconductor substrate 302a and 304a throughout the entire area.

Then the embedded P+ type anode region 300a of the suppresion diode 300 is disposed on its specified portion of the N− type grown layer 380 according to selective diffusion technique. Thereafter the second N− type semiconductor layer 382 is disposed on the first N− type semiconductor layer 380 to be coextensive therewith according to epitaxial growth technique.

Subsequently, selective diffusion technique is utilized to dispose simultaneously the P+ type base regions 302b and 304b of the power and driving transistors 302 and 304 respectively, the P+ type anode walls 300b of the suppression diode 300 and the P+ type isolation region 384 in their specified portions of the second N− type semiconductor layer 382. At that time, the N− type cathode region 300c is defined by the anode region 300a and the anode walls 300b of the suppression diode 300.

Also selective diffusion technique is used to dispose simultaneously the N+ type emitter regions 302c and 304c of the power and driving transistors 302 and 304 in the P+ type base regions 302b and 304b thereof, as well as the N+ type collector region 310a of the control transistor 310, the N+ type semiconductor regions 312a and 318a for the Zener diode 312 and the resistor 318 in their specified portions of the P+ type isolation region 384 respectively with N+ type semiconductor regions for the remaining resistors.

Following this, the P+ type base region 310b of the control transistor 310, the P+ type anode region 312b of Zener diode 312 and the P+ type resistance region 318b are simultaneouly disposed in the collector region 310a, and the N+ type semiconductor portions 312a and 318a according to the selective diffusion technique. At that time, the P+ type resistance portions for the remaining resistors are similarly disposed in the associated N+ type semiconductor portions.

Finally, selective diffusion technique is also used to dispose simultaneously the N+ type diode cathode region 300d, the N+ type control emitter region 310c and the N+ type Zener cathode region 312c in the N− type diode cathode region 300c, the P+ type control base region 310b and the P+ type Zener anode region 312b respectively.

At that time, the arrangement of FIG. 5 is completed.

Subsequently electrodes are attached to the associated semiconductor regions in the manner well known in the art and bonding technique is utilized to interconnect the elements as shown in FIG. 1 whereupon a integrated semiconductor element 360 such as shown in FIGS. 3 and 4 is completed.

The present invention has several advantages. For example, the present invention is high in reliability because all the active elements are integrated on a single semiconductor substrate with or without some of the passive elements, that is, the resistors, resulting in a decrease in number of structural elements forming the semiconductor voltage regulator. This decrease in number of the structural elements is attended with a great decrease in the number of bondings. Also the automatic assembling can be easily be effected and therefore the mass-productivity can be increased. Further the resulting device is small-sized and inexpensive because, since heat is principally generated in the integrated semiconductor element, an associated casing is required only to be dimensioned large enough to encase a heat sink sufficient to dissipate that heat and a ceramic substrate having only the passive elements disposed thereon. Moreover, the semiconductor substrate includes the power transistor with the driving transistor located to be relatively remote from the control transistor thereon and forms the collector region of the power transistor in which heat is mostly generated. Therefore, it is possible to dispose both a high power transistor, able to withstand high voltages and having a high resistance to thermal breakdowns, and a control transistor capable of handling low signals, on the same semiconductor substrate. Accordingly, the resulting device has also a high resistance to thermal breakdown. In addition, the device of the present invention may be mass-produced with existing manufacturing techniques and without the necessity of employing a special manufacturing technique.

Also, in the arrangement of FIG. 4 including the integrated semiconductor element 360 directly brazed to the heat sink 370, the effect of heat dissipation is particularly excellent and the heat sink 370 serves as the connection terminal 324 (see FIG. 1) because the same is at the collector potential of the power transistor 302.

While the present invention has been illustrated and described in conjunction with a few preferred embodiments thereof it is to be understood that numerous changes and modifications may be resorted to without departing from the spirit and scope of the present invention.

What we claim is:

1. A semiconductor voltage regulator device comprising: a power transistor connected between one end of a field coil disposed on an AC generator and ground, said field coil having the other end thereof connected to a D.C. potential and being excited with a full-wave rectified output voltage from said AC generator; a control circuit for controlling the ON-OFF operation of said power transistor to thereby control an output voltage from said AC generator to a predetermined magnitude; a two layer semiconductor diode for absorbing induction energy generated by said field coil; and a common semiconductor substrate having said power transistor, said control circuit and said semiconductor diode disposed thereon, wherein said substrate forms the collector region of said power transistor and one of said two semiconductor diode layers.

2. A semiconductor voltage regulator device comprising: a power transistor connected between one end of a field coil disposed on an AC generator and ground, said field coil having the other end thereof connected to a D.C. potential and being excited with a rectified output voltage from said AC generator; a drive transistor of the same conductivity type as said power transistor connected to said power transistor to form a Darlington pair circuit configuration; a control circuit for controlling the ON-OFF operation of said drive transistor to thereby control an output voltage from said generator to a predetermined magnitude; and a semiconductor diode for absorbing induction energy generated by said field coil; wherein there are provided: a first lightly doped semiconductor layer of a first conductivity including portions forming collector regions of said power and drive transistors respectively; a buried heavily doped first layer of said semiconductor diode selectively diffused into said first lightly doped semiconductor layer, said heavily doped first layer of a second conductivity which is opposite from said first lightly doped layer of said first conductivity; a second lightly doped semiconductor layer of said first conductivity epitaxially grown on said first lightly doped semiconductor layer and including a portion thereof underlaid with said buried heavily doped first layer to form a second layer of said semiconductor diode; a plurality of heavily doped semiconductor layers of said second conductivity selectively diffused into said second lightly doped semiconductor layer to respectively form base regions of said power and drive transistors and a first layer wall of said semiconductor diode; and a heavily doped emitter layer of said first conductivity diffused into said heavily doped semiconductor layers forming each of said base regions.

3. A semiconductor voltage regulator device comprising: an NPN power transistor connected between one end of a field coil disposed on an AC generator and ground, said field coil having the other end thereof connected to a positive potential and being excited with a rectified output voltage from said AC generator; an NPN drive transistor connected to said NPN power transistor to form a Darlington pair circuit configuration; a control circuit for controlling the ON-OFF operation of said NPN drive transistor to thereby control an output voltage from said generator to a predetermined magnitude; and a semiconductor diode for absorbing induction energy generated by said field coil; wherein there are provided: a first $N^-$ semiconductor layer including portions forming collector regions of said NPN power and drive transistors respectively; a buried $P^+$ anode layer of said semiconductor diode selectively diffused into said first $N^-$ semiconductor layer; a second $N^-$ semiconductor layer epitaxially grown on said first $N^-$ semiconductor layer and including a portion thereof underlaid with said buried anode layer to form a cathode layer of said semiconductor diode; a plurality of $P^+$ semiconductor layers selectively diffused into said second $N^-$ semiconductor layer to respectively form base regions of said NPN power and drive transistors and an anode wall of said semiconductor diode; and an $N^+$ emitter layer diffused into said $P^+$ semiconductor layers forming each of said base regions.

* * * * *